United States Patent [19]

Hiroshima et al.

[11] Patent Number: 4,468,758
[45] Date of Patent: Aug. 28, 1984

[54] MAGNETIC BUBBLE MEMORY CHIP

[75] Inventors: Minoru Hiroshima, Mobara; Kohzo Hara, Musashino; Ryo Suzuki, Kodaira; Masatoshi Takeshita, Hachioji, all of Japan

[73] Assignee: Hitachi, Ltd., Tokyo, Japan

[21] Appl. No.: 378,744

[22] Filed: Jun. 17, 1982

[51] Int. Cl.³ ............................................. G11C 19/08
[52] U.S. Cl. ............................................. 365/15
[58] Field of Search ............................................. 365/15, 16

[56] References Cited

U.S. PATENT DOCUMENTS 4,176,404 11/1979 Dimyan et al. .................. 365/12
4,263,661 4/1981 Chea et al. ........................ 365/15

OTHER PUBLICATIONS

Journal of Applied Physics–vol. 50, No. 3, Mar. 1979, pp. 2225–2227.

Primary Examiner—James W. Moffiti
Attorney, Agent, or Firm—Charles E. Pfund

[57] ABSTRACT

A magnetic bubble memory chip comprises minor loops of a folded structure for storing information in the form of magnetic bubble domains, and input and output tracks for transferring the information into and out of the minor loops. The input and output tracks have a pattern repetition period that is four or more times as large as a fundamental period of each of the minor loops.

1 Claim, 7 Drawing Figures

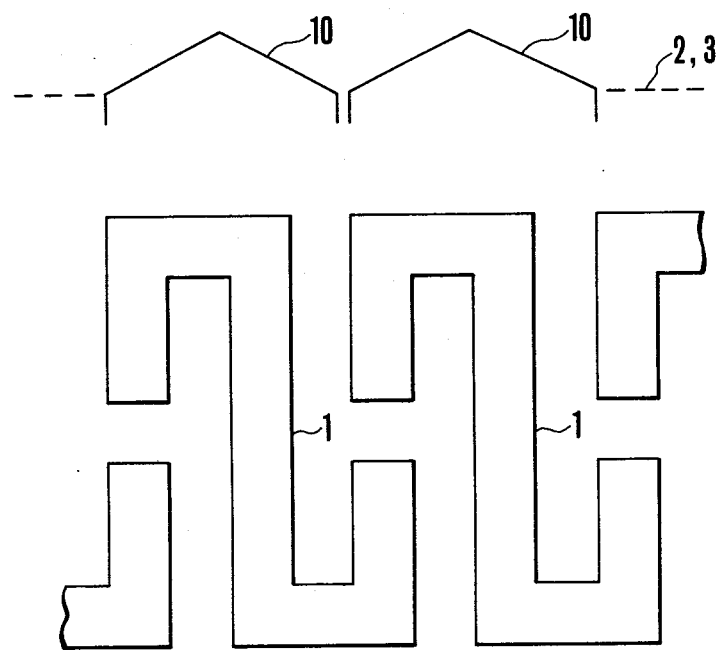
F I G. 4

MAGNETIC BUBBLE MEMORY CHIP

BACKGROUND OF THE INVENTION

The present invention relates to a magnetic bubble memory chip, and more particularly to a pattern structure of input and output tracks for transferring magnetic bubble information into and out of minor loops.

There have heretofore been known various types of input and output tracks in magnetic bubble memories. The prior art track patterns, however, are disadvantageous in that the speed at which information can be propagated along the input and output tracks is relatively low and consequently, the data transfer rate is low.

SUMMARY OF THE INVENTION

It is an object of the present invention to provide a magnetic bubble memory chip having an input and output track pattern capable of propagating one bit information from one propagation element associated with one minor loop to a next propagation element associated with a next minor loop at a rate of one bit per one cycle of the rotating field applied to the chip for propagation of magnetic bubble domains.

According to the present invention, a magnetic bubble memory chip comprises folded minor loops for storing magnetic bubble information, and input and output tracks for transferring the magnetic bubble information into and out of the minor loops, the input and output tracks having a pattern repetition period that is four or more times as large as a fundamental period of each of the minor loops.

The above and other objects, features and advantages of the present invention will become more apparent from the following description when taken in conjunction with the accompanying drawings in which a preferred embodiment of the invention is shown by way of illustrative example.

BRIEF DESCRIPTION OF THE DRAWINGS

FIG. 4 is an enlarged fragmentary plan view of a magnetic bubble memory chip according to the present invention.

DESCRIPTION OF PREFERRED EMBODIMENT

Figure 1:
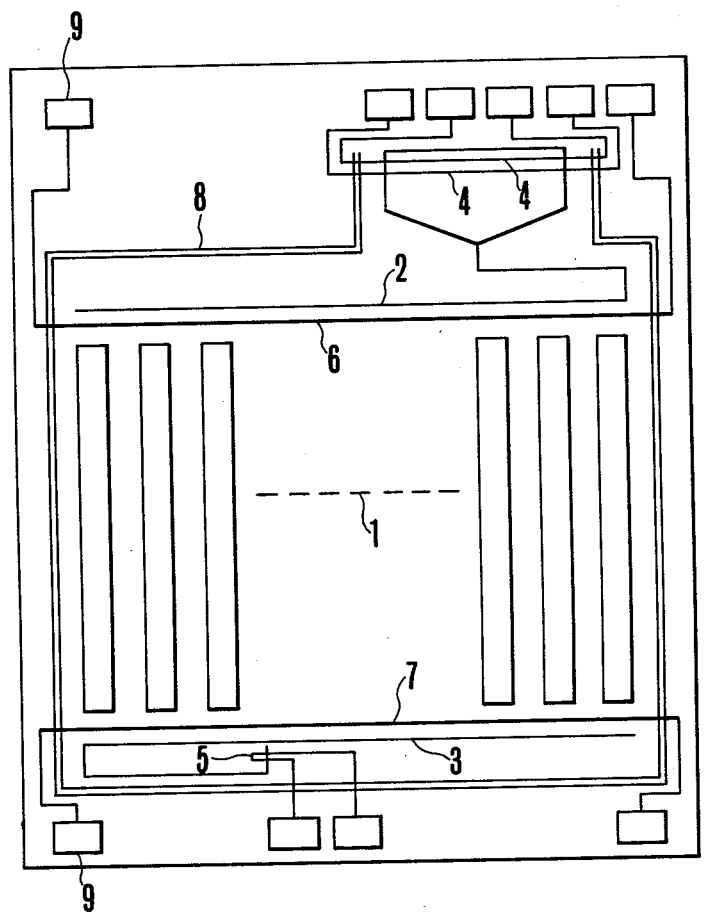
FIG. 1 is an enlarged plan view of a magnetic bubble memory chip.

FIG. 1 shows a circuit arrangement of a magnetic bubble memory chip. The magnetic bubble memory chip comprises minor loops 1 for storing information in the form of magnetic bubble domains, a read major line 2 for propagating read information, a write major line 3 for propagating information to be written, a magnetic bubble detector 4 for converting magnetic bubbles on the read major line 2 into electrical signals, and a magnetic bubble generator 5 for writing information into the write major line 3. Information on the minor loops 1 is replicated into the read major line 2 by a replicate gate 6. Information on the write major line 3 is exchanged with information on the minor loops 1 by a swap gate 7. A guard rail 8 serves to prevent entry of unwanted magnetic bubbles from a surrounding portion. The transfer circuits are connected to external circuits by bonding pads 9.

Figure 2C:
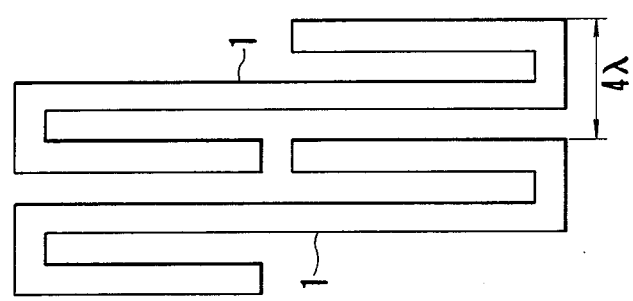
FIGS. 2a, 2b and 2c are enlarged plan views of minor loops.
Figure 2B:
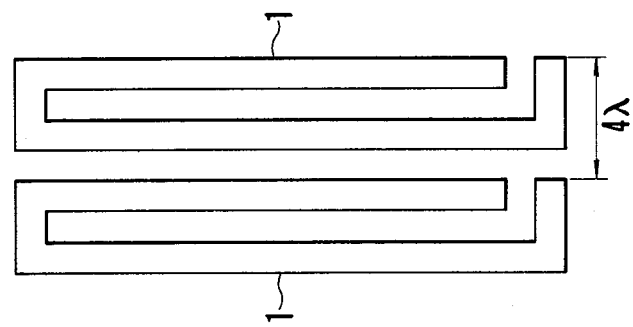
Figure 2A:
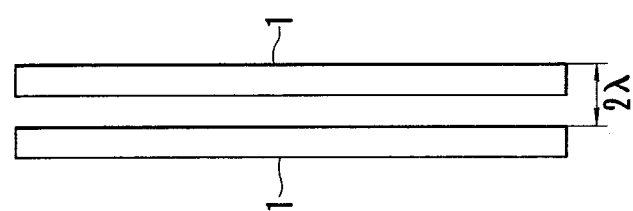

FIGS. 2a, 2b and 2c are illustrative of minor loop structures which have found wide use in magnetic bubble memories. Minor loops 1 as shown in FIG. 2a are the oldest of these illustrated minor loops, and are in the form of a closed loop, which is known as an I-type. The minor loops shown in FIG. 1 are of the type illustrated in FIG. 2a. FIGS. 2b and 2c show minor loops 1 which have recently been used in the art. These minor loops are of a folded construction and are best suited for use on highly integrated and highly compact memory chips. The minor loops as shown in FIG. 2b are known as a G-type, and those as shown in FIG. 2c are an S-type. The present invention is applicable to minor loops of the folded construction as shown in FIGS. 2b, 2c and so on.

Figure 3A:
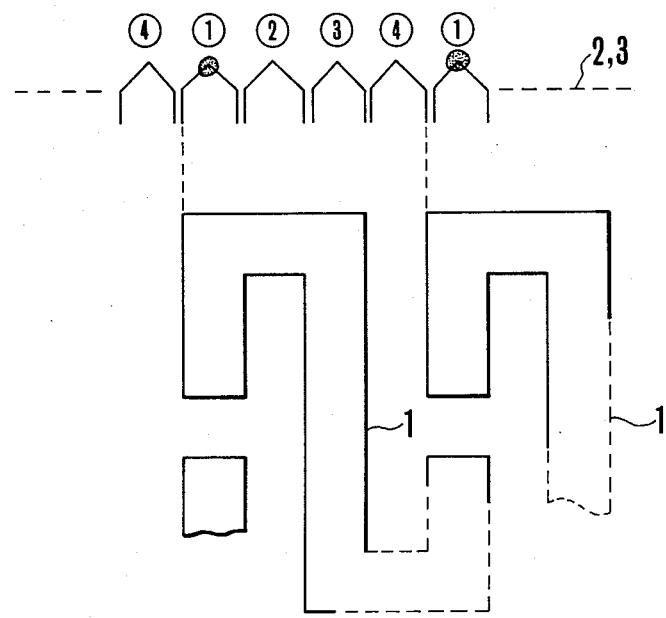
FIGS. 3a and 3b are enlarged fragmentary plan views of minor loops in conventional magnetic bubble memory chips.
Figure 3B:
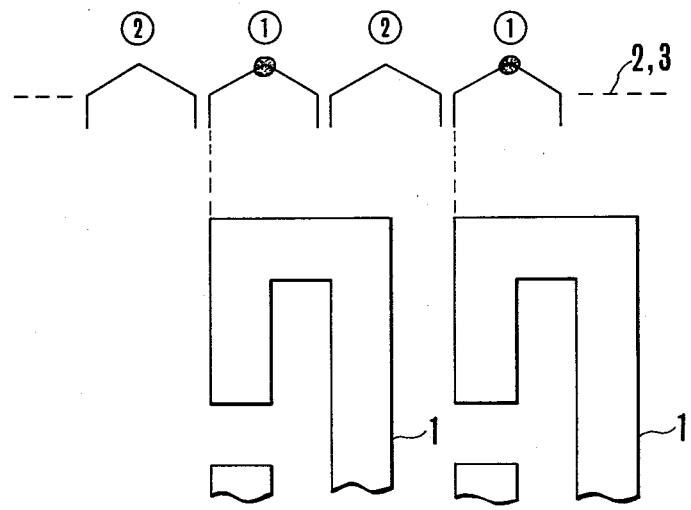

Heretofore, input and output tracks of the replicate gate 6 and the swap gate 7 (FIG. 1) which confront the minor loops 1 are of a pattern having a repetition period that is the same as or twice as large as a fundamental period λ of each of the minor loop transfer channels. The period l of repetition of the minor loops as shown in FIG. 2a is 2λ, and that of the minor loops as shown in FIGS. 2b and 2c is 4λ. The folded minor loops 1 illustrated in FIGS. 2b and 2c are associated with the input and output tracks of the replicate and swap gates 6 and 7 (FIG. 1), as shown in FIGS. 3a and 3b. More specifically, a single minor loop 1 is coupled with the input and output tracks through 4 bits as shown in FIG. 3a, or through 2 bits as shown in FIG. 3b.

With the foregoing arrangements, one bit of information (for example, the presence of magnetic bubble domain indicative of logic "1" at propagation element ① associated with one minor loop can reach a next minor loop after propagation of four bits (propagation elements ④, ③, ② and ① ) in FIG. 3a, and in FIG. 3b, one bit information (for example, the presence of magnetic bubble domain indicative of logic "1" at propagation element ① ) can reach the next minor loop after propagation of two bits (propagation elements ② and ① ). Therefore, the speed at which information can be propagated through the input and output tracks is relatively low, and as a result, the data transfer rate is reduced.

A magnetic bubble memory chip according to the present invention will now be described with reference to FIG. 4. Like or corresponding parts in FIG. 4 are denoted by like or corresponding reference numerals in FIGS. 3a and 3b. In FIG. 4, the input and output tracks of the replicate and swap gates 6 and 7 which confront the minor loops 1 of a folded structure have patterns 10 each of a repetition period which is four times as large as a fundamental period of each of the minor loops. Each minor loop 1 is thus associated in one to one correspondence with one of the track patterns 10 which has one bit. With the arrangement of the present invention, one bit information can propagate from one propagation element associated with one minor loop to the next propagation element associated with the next minor loop at a rate of one cycle of the rotating field. Therefore, the data propagation rate is four times the fundamental period of the track pattern as shown in FIG. 3a, and twice the fundamental period of the track pattern as illustrated in FIG. 3b, and the data transfer rate can be improved.

Although a preferred embodiment of the present invention has been shown and described which has a pattern repetition period that is four times the fundamental period of each minor loop, this multiple is not limited to four but may be more than four. For example, the input and output track pattern may have a six-times period in the case of a triply folded minor loop, and an eight-times period in the case of a quadruply folded minor loop. In these cases, the data transfer rate can also be improved.

What is claimed is:

1. A magnetic bubble memory chip comprising folded minor loops for storing magnetic bubble information, and input and output tracks for transferring the magnetic bubble information into and out of said minor loops, said input and output tracks having a pattern repetition period that is four or more times as large as a fundamental period of each of said minor loops in order to propagate one bit information from one propagation element of said input and output tracks, associated with one minor loop, to a next propagation element associated with a next minor loop at a rate of one bit per cycle of the rotating field applied to the chip for propagation of magnetic bubble domains.

* * * * *